(12) United States Patent
Naing

(10) Patent No.: US 7,899,141 B2
(45) Date of Patent: Mar. 1, 2011

(54) RECEIVER FOR RECEIVING RADIO FREQUENCY SIGNALS

(75) Inventor: Maw Maw Naing, Singapore (SG)

(73) Assignee: NXP B.V., Eindhoven (NL)

( * ) Notice: Subject to any disclaimer, the term of this patent is extended or adjusted under 35 U.S.C. 154(b) by 1200 days.

(21) Appl. No.: 10/560,714

(22) PCT Filed: Jun. 18, 2004

(86) PCT No.: PCT/IB2004/050937
§ 371 (c)(1),
(2), (4) Date: Dec. 15, 2005

(87) PCT Pub. No.: WO2004/114653
PCT Pub. Date: Dec. 29, 2004

(65) Prior Publication Data
US 2006/0159208 A1    Jul. 20, 2006

(30) Foreign Application Priority Data
Jun. 20, 2003  (EP) .................................. 03101821

(51) Int. Cl.
*H04L 27/08* (2006.01)
(52) U.S. Cl. ....................... 375/345; 375/354
(58) Field of Classification Search ................ 375/354, 375/345; 455/136, 245.2
See application file for complete search history.

(56) References Cited

U.S. PATENT DOCUMENTS

| | | | |
|---|---|---|---|
| 5,194,822 A | 3/1993 | Bureau et al. | |
| 6,118,499 A * | 9/2000 | Fang | 348/726 |
| 6,154,503 A | 11/2000 | Strolle | |
| 7,187,733 B2 * | 3/2007 | Fujishima et al. | 375/345 |
| 2001/0055956 A1 * | 12/2001 | Konishi et al. | 455/245.2 |
| 2002/0131533 A1 * | 9/2002 | Koizumi | 375/345 |
| 2003/0022642 A1 * | 1/2003 | Kwun | 455/136 |
| 2006/0233288 A1 * | 10/2006 | Gruijters et al. | 375/343 |

FOREIGN PATENT DOCUMENTS

| | | |
|---|---|---|
| EP | 0 961 492 A2 | 12/1999 |
| EP | 1 164 788 A2 | 12/2001 |
| EP | 1 168 605 A2 | 1/2002 |
| GB | 2 348 328 A | 9/2000 |
| WO | WO 00/19709 | 4/2000 |

* cited by examiner

*Primary Examiner* — David C Payne
*Assistant Examiner* — Tanmay K Shah

(57) ABSTRACT

Receivers (1) for receiving radio frequency signals need automatic gain control alignment by hand during the production process, which makes the production process more expensive, more time-consuming and less reliable (insight). By (basic idea) providing receivers (1) with a first and a second gain controller (38, 54) for controlling the gains of a first (radio frequency) and a second (intermediate frequency) stage (3, 5) independently from each other, alignment by hand is no longer necessary, which results in a less expensive, less time-consuming and more reliable production process. The gain controllers (38, 54) have gain detectors (41, 59) for detecting output signals, and gain generators (40, 58) for generating gain control signals, and control inputs (42, 60) for receiving the same reference level signal (REF) for controlling the gains in relation to the same reference level.

12 Claims, 2 Drawing Sheets

RECEIVER FOR RECEIVING RADIO FREQUENCY SIGNALS

Figure 1:
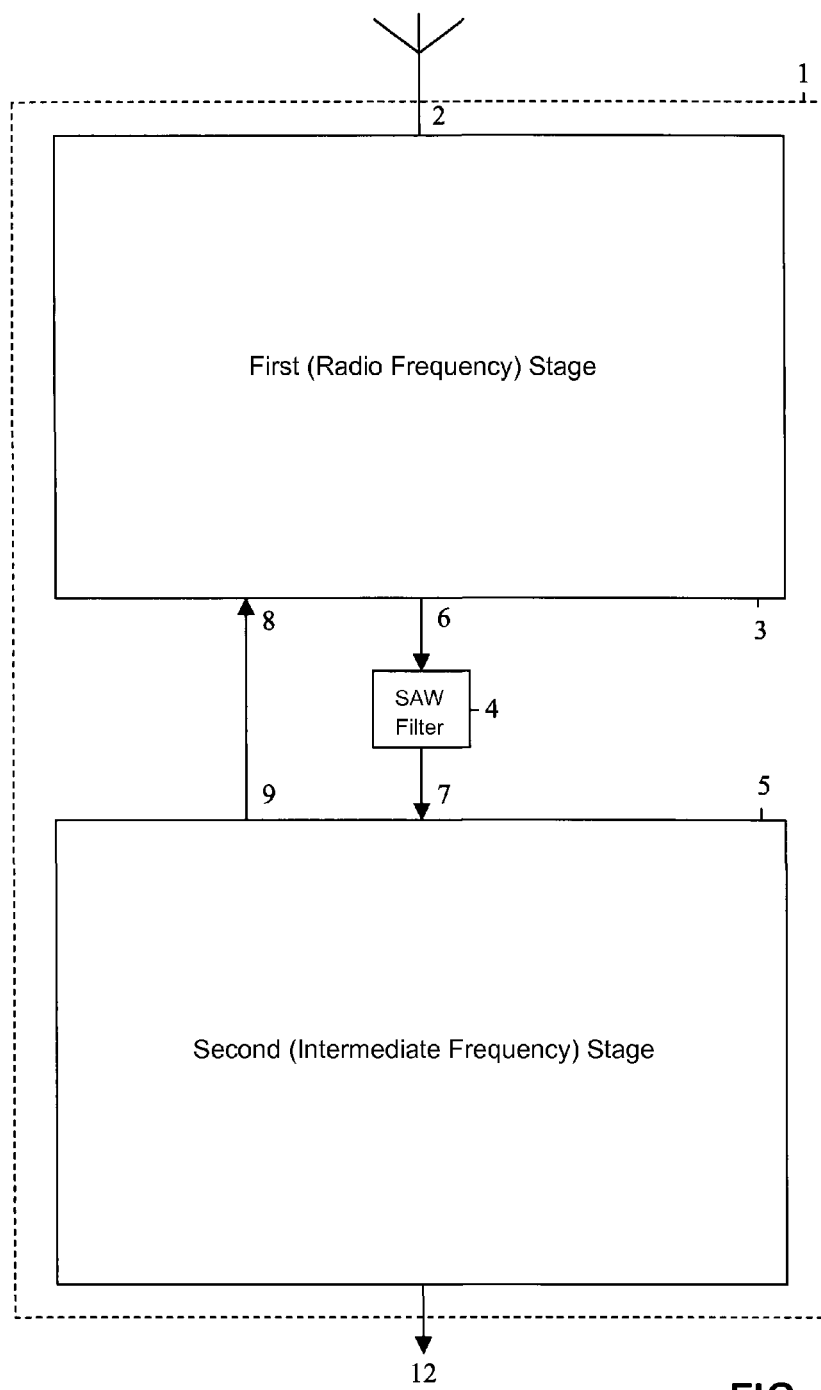

The invention relates to a receiver for receiving radio frequency signals, and also relates to a tuner, a demodulator, a processor, a method and a processor program product.

Such a receiver for example corresponds with a television receiver comprising two or more receiver stages, a first radio frequency stage for example forming part of and/or corresponding with a tuner, and a second intermediate frequency stage for example forming part of and/or corresponding with a demodulator.

A prior art receiver is known from EP 0 961 492 A2, which discloses a tuner for receiving an analog television signal and a digital television signal. To be able to tune and demodulate both kinds of signals, two demodulator-detector-combinations are provided, whereby one of the combinations is switched and coupled to the tuner in dependence of the kind of signals arriving. For getting an automatic gain control, the detector is fed back to an amplifier in the tuner via a voltage converting circuit.

The known receiver is disadvantageous, inter alia, due to requiring automatic gain control alignment of the tuner during the production process. This alignment is done by hand, which makes the production process more expensive, more time-consuming and less reliable.

It is an object of the invention, inter alia, of providing a receiver that does not require alignment by hand during the production process. The invention is defined by the independent claims. The dependent claims define advantageous embodiments.

Further objects of the invention are, inter alia, providing a tuner, a demodulator and a processor for use in a receiver that does not require alignment by hand during the production process, and a method and a computer program product for receiving radio frequency signals without requiring alignment by hand.

By providing the receiver with two or more gain controllers for controlling the gains of the two or more stages independently from each other, alignment by hand is no longer necessary. As a result, the production process will be less expensive, less time-consuming and more reliable. Further, calibration, replacement and repairing costs are avoided, and an improved signal-to-noise ratio will be achieved independently of circuit deviations and for the entire life of the receiver, not just during the production process.

It should be noted that it is known to use two gain controllers for controlling the gains of the two stages. However, these two gain controllers do not control the gains independently from each other, the second gain controller in this prior art case also controls the first gain controller. Under these prior art circumstances, alignment by hand during the production process is still necessary.

A first embodiment of the receiver according to the invention is defined by claim 2. By adjusting both gain controllers at the same reference level for controlling the gains in relation to this reference level, both stages are gain controlled in relation to the same reference level. As a result, both stages are coupled optimally (and a further improved signal-to-noise ratio will be achieved). This reference level is chosen during the designing process and in dependence of the design.

A second embodiment of the receiver according to the invention is defined by claim 3. By providing the first gain controller with a first gain detector for detecting an output signal of one or more first intermediate frequency amplifiers in the second stage and with a first gain generator for generating, in response to the detecting, a first gain control signal to be supplied to a control input of a radio frequency amplifier in the first stage, a simple first gain controller has been created which controls the gain of the first stage including a filter (like for example a SAW filter) located between the first stage and the second stage.

A third embodiment of the receiver according to the invention is defined by claim 4. By providing the second gain controller with a second gain detector for detecting an output signal of one or more intermediate frequency demodulator stages and with a second gain generator for generating, in response to the detecting, a second gain control signal to be supplied to a control input of one or more second intermediate frequency amplifiers in the second stage, a simple second gain controller has been created.

Each one of the gain controllers may for example comprise an analog-to-digital converter, a processor with one or more memories like for example table memories, and a digital-to-analog converter as disclosed in U.S. Pat. No. 5,194,822. Or, each one of the gain controllers may have a kind of Phase Locked Loop or Feedback Loop construction.

Embodiments of the tuner according to the invention and of the demodulator according to the invention and of the processor according to the invention and of the method according to the invention and of the processor program product according to the invention correspond with the embodiments of the receiver according to the invention.

The invention is based upon an insight, inter alia, that alignment by hand makes the production process expensive, more time-consuming and less reliable, and is based upon a basic idea, inter alia, that two or more gain controllers for controlling the gains of two or more stages independently from each other can replace this aligning.

The invention solves the problem, inter alia, of providing a receiver that does not require alignment by hand during the production process, and is advantageous, inter alia, in that the production process will be less expensive, less time-consuming and more reliable. Further, calibration, replacement and repairing costs are avoided, and an improved signal-to-noise ratio will be achieved independently of circuit deviations and for the entire life of the receiver, not just during the production process.

These and other aspects of the invention will be apparent from and elucidated with reference to the embodiments(s) described hereinafter.

Figure 2:
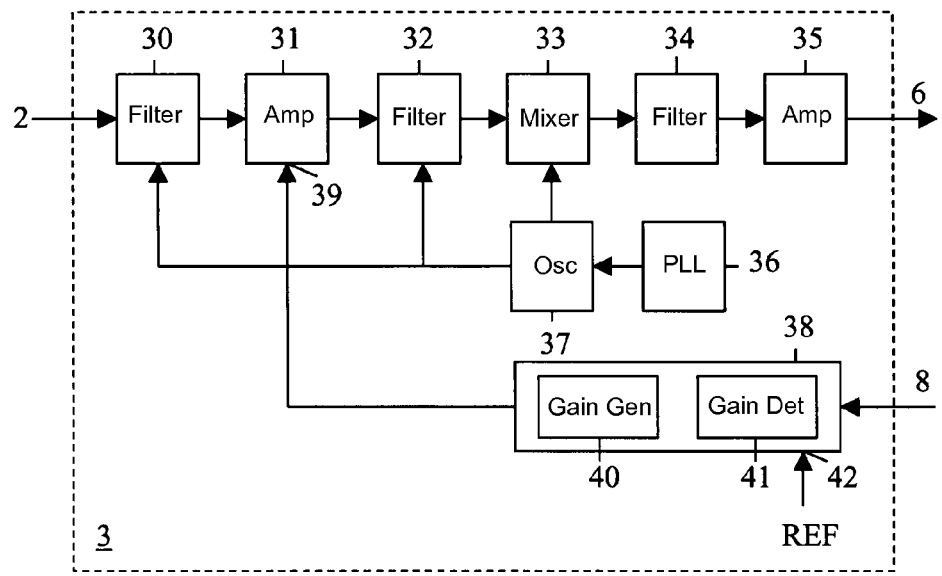
Figure 3:
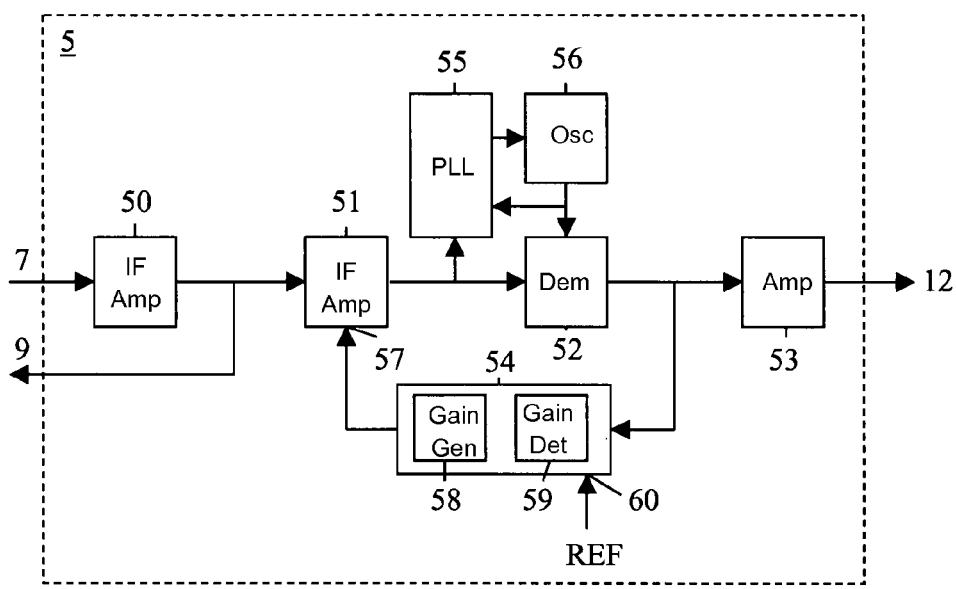

FIG. 1 shows diagrammatically a receiver according to the invention comprising a first stage and a second stage, FIG. 2 shows diagrammatically a first stage with a first gain controller, and FIG. 3 shows diagrammatically a second stage with a second gain controller.

The receiver 1 according to the invention shown in FIG. 1 comprises a first (radio frequency) stage 3 having a radio frequency input 2 coupled to an antenna for receiving a radio frequency signal like a variety of modulated carriers and having an intermediate frequency output 6 coupled to an input of a SAW filter 4. An output of SAW filter 4 is coupled to an input 7 of a second (intermediate frequency) stage 5 having a video output 12 for generating a video signal. First stage 3 further comprises a control input 8 coupled to a control output 9 of second stage 5.

First stage 3 shown in FIG. 2 comprises a filter 30 of which an input is coupled to input 2 and of which an output is coupled to an input of a radio frequency amplifier 31. An output of radio frequency amplifier 31 is coupled to an input of a filter 32, of which an output is coupled to a first input of a mixer 33. An output of mixer 33 is coupled to an input of a filter 34, of which an output is coupled to an input of a further amplifier 35. An output of further amplifier 35 is coupled to output 6. First stage 3 further comprises a Phase Locked Loop 36 (possibly including a crystal clock) of which an output is coupled to an input of an oscillator 37. A first output of oscillator 37 is coupled to a second input of mixer 33, and a second output of oscillator 37 is coupled to control inputs of filters 30 and 32. An input of a first gain controller 38 comprising a first gain detector 41 and a first gain generator 40 is coupled to control input 8, and a control input 42 of first gain controller 38 receives a reference level signal REF, and an output of first gain controller 38 is coupled to a control input 39 of radio frequency amplifier 31 for varying an amplification factor of radio frequency amplifier 31.

Second stage 5 shown in FIG. 3 comprises one or more first intermediate frequency amplifiers 50 of which an input is coupled to input 7 and of which an output is coupled to an input of one or more second intermediate frequency amplifiers 51 and to control output 9. An output of second intermediate frequency amplifier 51 is coupled to a first input of an intermediate frequency demodulator stage 52, of which an output is coupled to an input of a video amplifier 53 and to an input of a second gain controller 54 comprising a second gain detector 59 and a second gain generator 58. An output of video amplifier 53 is coupled to video output 12, and an output of second gain controller 54 is coupled to a control input 57 of second intermediate frequency amplifier 51 for varying an amplification factor of second intermediate frequency amplifier 51, and a control input 60 of second gain controller 54 receives the reference level signal REF. Second stage 5 further comprises a Phase Locked Loop 55 of which a first input is coupled to an output of second intermediate frequency amplifier 51 and of which a second input is coupled to an output of an oscillator 56 and of which an output is coupled to an input of oscillator 56. The output of oscillator 56 is further coupled to a second input of intermediate frequency demodulator stage 52.

The receiver 1 according to the invention functions as follows. Suppose from the antenna at radio frequency input 2 a radio frequency signal is received at 100 dBuV. In case of the first stage 3 having a gain of 50 dB and the SAW filter 4 loss being 20 dB, without the first gain controller 38 being active, the intermediate frequency signal supplied to first intermediate frequency amplifier 50 will be at 130 dBuV and in case of this first intermediate frequency amplifier 50 having a gain of 5 dB (the gain of first intermediate frequency amplifier 50 is chosen low to be more accurate, higher gains would show larger deviations), the intermediate frequency signal at the output of first intermediate frequency amplifier 50 will be at 135 dBuV. First gain controller 38 compares the 135 dBuV with the reference level set by the (intermediate) reference level signal REF, for example 100 dBuV. The difference between 135 dBuV and 100 dBuV results in a first gain control signal being supplied to control input 39 of radio frequency amplifier 31 in the first stage 3. In response to this first gain control signal, the amplification factor of radio frequency amplifier 31 is varied such that the first stage 3 gets a gain of 20 dB (30 dB reduction). Then the intermediate frequency signal supplied to first intermediate frequency amplifier 50 will be at 105 dBuV and in case of this first intermediate frequency amplifier 50 having a gain of 5 dB, the intermediate frequency signal at the output of first intermediate frequency amplifier 50 will be at 100 dBuV, which is the reference level set by the (intermediate) reference level signal REF.

In second stage 5, second intermediate frequency amplifier 51 for example comprises two amplifiers with gains of 25 dB and 35 dB. Second gain controller 54 compares the output signal of intermediate frequency demodulator stage 52 with a standard level, for example 2 Vpp or 1 Vpp etc. The difference between the output signal and this standard level results in a second gain control signal being supplied to control input 57 of second intermediate frequency amplifier 51 in the second stage 5. In response to this second gain control signal, the amplification factor of second intermediate frequency amplifier 51 (of one or of both amplifiers) is varied such that the second stage 5 gets a gain such that the output signal of intermediate frequency demodulator stage 52 is at the standard level. Alternatively, the output signal of second intermediate frequency amplifier 51 may be detected by second gain controller 54. Generally, the reference level set by the (intermediate) reference level signal REF defines a desired output level of the first intermediate frequency amplifier 50. The (intermediate) reference level signal REF supplied to second gain controller 54 limits the gain reduction at the second intermediate frequency amplifier 51. The maximum gain reduction at the second intermediate frequency amplifier 51 is for example equal to the reference level set by the (intermediate) reference level signal REF plus the gain of first and second intermediate frequency amplifiers 50 and 51 minus the standard level of the output signal of intermediate frequency demodulator stage 52; other functions and/or equations are not to be excluded. The maximum gain reduction limitation is required to avoid an excessive gain reduction in the second intermediate frequency amplifier 51 that leads to a deteriorated signal-to-noise ration.

As a result of letting gain controllers 38 and 54 control the gains of the first and the second stage 3 and 5 independently from each other, automatic gain control alignment during the production process can be avoided advantageously.

Second gain controller 54 for example comprises an analog-to-digital converter, a processor with one or more memories like for example table memories, and a digital-to-analog converter. Then, second gain detector 59 comprises the analog-to-digital converter and a part of the processor and the memories, and the second gain generator 58 comprises the other part of the processor and the memories and the digital-to-analog converter. In the case, control input 60 for example forms a control input of second gain detector 59 for receiving the reference level signal REF (like for example 100 dBuV or AGC DAC step 10). For example the following table is thereby implemented (AGC DAC=Automatic Gain Control Digital to Analog Converter).

| AGC DAC step | Reference level signal REF (in dBuV) |
|---|---|
| 00 | 110 |
| 01 | 109 |
| 02 | 108 |
| . | . |
| . | . |
| . | . |
| 18 | 92 |
| 19 | 91 |
| 20 | 90 |

First gain controller 38 for example comprises an analog-to-digital converter, a processor with one or more memories like for example table memories, and a digital-to-analog converter. Then, first gain detector 41 comprises the analog-to-digital converter and a part of the processor and the memories, and the second gain generator 40 comprises the other part of the processor and the memories and the digital-to-analog converter. In that case, control input 42 for example forms a control input of first gain detector 41 for receiving the reference level signal REF (like for example 100 dBuV or AGC DAC step 10). As a result of supplying the same reference level signal REF to second gain controller 54 and to first gain controller 38, both stages 3 and 5 are gain controlled in relation to the same reference level, and are therefore coupled optimally. This reference level is chosen during the designing process and in dependence of the design.

Alternatively, each one of the gain controllers 38,54 may have a kind of Phase Locked Loop or Feedback Loop construction. First gain controller 38 may form part of first stage 3 or not, and/or may be integrated into radio frequency amplifier 31 or not, and/or may be integrated into first intermediate frequency amplifier 50 or not. Second gain controller 54 may form part of second stage 5 or not, and/or may be integrated into second intermediate frequency amplifier 51 or not, etc.

The expression "for" in for example "for A" and "for B" does not exclude that other functions "for C" are performed as well, simultaneously or not. The expressions "X coupled to Y" and "a coupling between X and Y" and "coupling/couples X and Y" etc. do not exclude that an element Z is in between X and Y. The expressions "P comprises Q" and "P comprising Q" etc. do not exclude that an element R is comprised/included as well.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A receiver for receiving radio frequency signals and comprising:
   a first stage for amplifying and tuning radio frequency signals and for generating intermediate frequency signals;
   a first gain controller for controlling a gain of the first stage;
   a second stage for amplifying and demodulating the intermediate frequency signals; and
   a second gain controller for controlling a gain of the second stage; which first and second gain controllers control the gains independently from each other with the first gain controller to control the gain of the first stage based on a modulated intermediate frequency signal at an input of the first gain controller, and the second gain controller to control the gain of the second stage based on a demodulated intermediate frequency signal at an input of the second gain controller,
   wherein both gain controllers are adjusted at the same reference level for controlling the gains in relation to this reference level.

2. A receiver according to claim 1, wherein the second stage comprises a first intermediate frequency amplifier and a second intermediate frequency amplifier, with the first gain controller comprising a first gain detector for detecting an output signal of the first intermediate frequency amplifier and a first gain generator for generating, in response to the detecting, a first gain control signal to be supplied to a control input of a radio frequency amplifier in the first stage.

3. A receiver according to claim 2, wherein the second stage comprises an intermediate frequency demodulator stage having an input coupled to an output of the second intermediate frequency amplifier and an output coupled to an input of a video amplifier for generating a video signal, with the second gain controller comprising a second gain detector for detecting an output signal of the intermediate frequency demodulator stage and a second gain generator for generating, in response to the detecting, a second gain control signal to be supplied to a control input of the second intermediate frequency amplifier.

4. A tuner for use in a receiver for receiving radio frequency signals, which receiver comprises
   a first stage for amplifying and tuning radio frequency signals and for generating intermediate frequency signals;
   a first gain controller for controlling a gain of the first stage;
   a second stage for amplifying and demodulating the intermediate frequency signals;
   a second gain controller for controlling a gain of the second stage; which first and second gain controllers control the gains independently from each other with the first gain controller to control the gain of the first stage based on a modulated intermediate frequency signal at an input of the first gain controller, and the second gain controller to control the gain of the second stage based on a demodulated intermediate frequency signal at an input of the second gain controller, and which tuner comprises the first stage and the first gain controller,
   wherein both gain controllers are adjusted at the same reference level for controlling the gains in relation to this reference level.

5. A tuner according to claim 4, wherein the second stage comprises a first intermediate frequency amplifier and a second intermediate frequency amplifier, with the first gain controller comprising a first gain detector for detecting an output signal of the first intermediate frequency amplifier and a first gain generator for generating, in response to the detecting, a first gain control signal to be supplied to a control input of a radio frequency amplifier in the first stage.

6. A tuner according to claim 5, wherein the second stage comprises an intermediate frequency demodulator stage having an input coupled to an output of the second intermediate frequency amplifier and an output coupled to an input of a video amplifier for generating a video signal, with the second gain controller comprising a second gain detector for detecting an output signal of the intermediate frequency demodulator stage and a second gain generator for generating, in response to the detecting, a second gain control signal to be supplied to a control input of the second intermediate frequency amplifier.

7. A demodulator for use in a receiver for receiving radio frequency signals, which receiver comprises:
   a first stage for amplifying and tuning radio frequency signals and for generating intermediate frequency signals;
   a first gain controller for controlling a: gain of the first stage;
   a second stage for amplifying and demodulating the intermediate frequency signals; and
   a second gain controller for controlling a gain of the second stage; which first and second gain controllers control the gains independently from each other with the first gain controller to control the gain of the first stage based on a modulated intermediate frequency signal at an input of the first gain controller, and the second gain controller to control the gain of the second stage based on a demodulated intermediate frequency signal at an input of the second gain controller, and which demodulator comprises the second stage and the second gain controller, wherein both gain controllers are adjusted at the same reference level for controlling the gains in relation to this reference level.

8. A demodulator according to claim 7, wherein the second stage comprises a first intermediate frequency amplifier and a second intermediate frequency amplifier, with the first gain controller comprising a first gain detector for detecting an output signal of the first intermediate frequency amplifier and a first gain generator for generating, in response to the detecting, a first gain control signal to be supplied to a control input of a radio frequency amplifier in the first stage.

9. A demodulator according to claim 8, wherein the second stage comprises an intermediate frequency demodulator stage having an input coupled to an output of the second intermediate frequency amplifier and an output coupled to an input of a video amplifier for generating a video signal, with the second gain controller comprising a second gain detector for detecting an output signal of the intermediate frequency demodulator stage and a second gain generator for generating, in response to the detecting, a second gain control signal to be supplied to a control input of the second intermediate frequency amplifier.

10. A method for receiving radio frequency signals and comprising:
 a first step of amplifying and tuning radio frequency signals and of generating intermediate frequency signals;
 a second step of controlling a gain of the first step;
 a third step of amplifying and demodulating intermediate frequency signals;
 a fourth step of controlling a gain of the third step; which second and fourth steps control the gains independently from each other, wherein one of the control inputs for the gain controllers is taken from a modulated IF signal at an input of a first gain controller, and one of the control inputs for the gain controllers is taken from a demodulated IF signal at an input of a second gain controller, and
 adjusting the gain of the first and third steps at the same reference level for controlling the gains in relation to this reference level.

11. A method according to claim 10, wherein controlling the gain of the first step further comprises:
 detecting in a first stage an output signal of a first intermediate frequency amplifier in a second stage; and
 generating, in response to the detecting, a first gain control signal for controlling the gain of the first step.

12. A method according to claim 11, wherein controlling the gain of the second step further comprises:
 detecting in the second stage an output signal of an intermediate frequency demodulator stage; and
 generating, in response to the detecting, a second gain control signal for controlling the gain of the second step.

* * * * *